United States Patent
Chae et al.

(10) Patent No.: US 10,312,060 B2
(45) Date of Patent: Jun. 4, 2019

(54) PLASMA GENERATING APPARATUS USING MUTUAL INDUCTIVE COUPLING AND SUBSTRATE TREATING APPARATUS COMPRISING THE SAME

(71) Applicant: PSK INC., Gyeonggi-do (KR)

(72) Inventors: Hee Sun Chae, Hwaseong-si (KR); Jeong Hee Cho, Hwaseong-si (KR); Jong Sik Lee, Hwaseong-si (KR); Han Saem Rhee, Hwaseong-si (KR); Hyun Jun Kim, Hwaseong-si (KR)

(73) Assignee: PSK INC., Gyeonggi-do (KR)

( * ) Notice: Subject to any disclaimer, the term of this patent is extended or adjusted under 35 U.S.C. 154(b) by 329 days.

(21) Appl. No.: 14/516,766

(22) Filed: Oct. 17, 2014

(65) Prior Publication Data
US 2015/0144264 A1 May 28, 2015

(30) Foreign Application Priority Data
Nov. 22, 2013 (KR) .................. 10-2013-0143316

(51) Int. Cl.
H01J 37/32 (2006.01)

(52) U.S. Cl.
CPC ....... *H01J 37/3266* (2013.01); *H01J 37/3211* (2013.01); *H01J 37/32174* (2013.01)

(58) Field of Classification Search
CPC ............... H01J 37/3266; H01J 37/3211; H01J 37/32834; H01J 2237/334; H01J 37/32174
See application file for complete search history.

(56) References Cited

U.S. PATENT DOCUMENTS

| | | | | |
|---|---|---|---|---|
| 5,525,951 A | * | 6/1996 | Sunano | H01F 37/00 336/160 |
| 5,546,065 A | * | 8/1996 | Vinciarelli | H01F 27/346 336/212 |
| 5,907,221 A | | 5/1999 | Sato et al. | |
| 7,541,558 B2 | | 6/2009 | Smith et al. | |

(Continued)

FOREIGN PATENT DOCUMENTS

| | | |
|---|---|---|
| CN | 1901772 A | 1/2007 |
| CN | 101506950 A | 8/2009 |

(Continued)

OTHER PUBLICATIONS

V A Godyak, "Electrical and plasma parameters of ICP with high coupling efficiency", RF Plasma Consulting, Plasma Sources Sci. Technol. 20, 025004, 2011, 7pgs, Brookline, MA 024461, USA.

(Continued)

*Primary Examiner* — Yuechuan Yu
(74) *Attorney, Agent, or Firm* — Harness, Dickey & Pierce, P.L.C.

(57) ABSTRACT

Provided are a plasma generating apparatus using mutual inductive coupling and a substrate treating apparatus including the same. According to an embodiment of the present invention, a plasma generating apparatus includes: an RF power supply providing an RF signal; a plurality of electromagnetic field applying units inducing an electromagnetic field by receiving the RF signal; and a reactance element connected to a ground terminal of the electromagnetic field applying unit, wherein each of the electromagnetic field applying units may include a plurality of mutually-inductively coupled coils.

14 Claims, 9 Drawing Sheets

(56) References Cited

U.S. PATENT DOCUMENTS

| | | | |
|---|---|---|---|
| 8,088,263 B1* | 1/2012 | Smith | C23C 14/3407 |
| | | | 204/298.08 |
| 2002/0125828 A1* | 9/2002 | Doi | H01J 37/32082 |
| | | | 315/111.21 |
| 2002/0185228 A1* | 12/2002 | Chen | H01J 37/321 |
| | | | 156/345.48 |
| 2003/0015965 A1* | 1/2003 | Godyak | H01J 37/32009 |
| | | | 315/111.21 |
| 2003/0192644 A1* | 10/2003 | Pu | H01J 37/321 |
| | | | 156/345.28 |
| 2005/0000655 A1* | 1/2005 | Wi | H01J 37/32357 |
| | | | 156/345.48 |
| 2007/0145018 A1 | 6/2007 | Smith et al. | |
| 2009/0015165 A1* | 1/2009 | Jeon | H01J 37/32165 |
| | | | 315/111.51 |

FOREIGN PATENT DOCUMENTS

| | | | |
|---|---|---|---|
| JP | 2004-533090 A | | 10/2004 |
| JP | 2005285564 A | * | 10/2005 |
| JP | 2011-119659 A | | 6/2011 |
| KR | 10-2006-0108089 A | | 10/2006 |
| KR | 20060108089 A | * | 10/2006 |
| KR | 10-2007-0099854 A | | 10/2007 |
| KR | 10-0785164 B1 | | 12/2007 |
| TW | 417134 B | | 1/2001 |
| TW | I285926 B | | 8/2007 |
| TW | 200939895 A | | 9/2009 |
| TW | I398907 B | | 6/2013 |

OTHER PUBLICATIONS

K. H. Lee, "*Characterization of a Ferromagnetic Inductively Coupled Plasma*", Sae Multi, (The Korean Physical Society), 2007, 8pgs, vol. 55, No. 1.

E. Kändler, "Characterization of plasma in an inductively coupled high-dense plasma source", Surface and Coatings Technology vol. 74-75, Part 1, (1995), 7pgs.

* cited by examiner

PLASMA GENERATING APPARATUS USING MUTUAL INDUCTIVE COUPLING AND SUBSTRATE TREATING APPARATUS COMPRISING THE SAME

CROSS-REFERENCE TO RELATED APPLICATIONS

This U.S. non-provisional patent application claims priority under 35 U.S.C. § 119 of Korean Patent Application No. 10-2013-0143316, filed on Nov. 22, 2013, the entire contents of which are hereby incorporated by reference.

BACKGROUND OF THE INVENTION

The present invention disclosed herein relates to a plasma generating apparatus using mutual inductive coupling and a substrate treating apparatus including the same.

A process of manufacturing a semiconductor, a display device, a solar cell and the like includes a process of treating a substrate using plasma. For instance, an etching apparatus for dry etching or an ashing apparatus for ashing, which is used in a semiconductor manufacturing process, includes a chamber for generating plasma, and a substrate may be etched or ashed by the plasma.

Such a substrate treating apparatus applies a time-varying current to a coil installed in a chamber to induce an electromagnetic field in the chamber, and generates plasma from a gas supplied to the chamber by using the induced electromagnetic field.

Recently, a process of treating a large-area substrate with a diameter of about 450 mm is introduced, and thus a process yield loss becomes a big issue. Especially, plasma is required to be uniformly generated over a chamber to increase a yield of a plasma process. However, a plasma generating apparatus having a single induction coil structure has a limitation in that the coil has an input terminal voltage higher than a ground voltage and thus a voltage is non-uniformly distributed over the coil, causing plasma to be non-uniformly generated in a chamber.

SUMMARY OF THE INVENTION

The present invention provides a plasma generating apparatus generating plasma uniformly in a chamber and a substrate treating apparatus including the same.

The present invention also provides a plasma generating apparatus and a substrate treating apparatus including the same, which can increase a yield of a large-area substrate treating process.

Embodiments of the present invention provide plasma generating apparatuses including: an RF power supply providing an RF signal; a plurality of electromagnetic field applying units inducing an electromagnetic field by receiving the RF signal; and a reactance element coupled to a ground terminal of the electromagnetic field applying unit, wherein each of the electromagnetic field applying units includes a plurality of mutually-inductively coupled coils.

In some embodiments, the plurality of electromagnetic field applying units may be serially connected to each other.

In other embodiments, coils included in each of the electromagnetic field applying units may have the same number of turns.

In still other embodiments, the electromagnetic field applying unit may includes: a core made of a magnetic material; a primary coil wound around a portion of the core; and a secondary coil wound around another portion of the core.

In even other embodiments, the core may include: a first core forming a first closed loop; and a second core forming a second closed loop.

In yet other embodiments, the first core may include: a first sub core forming a half portion of the first closed loop; and a second sub core forming the remaining half portion of the first closed loop, and the second core may include: a third sub core forming a half portion of the second closed loop; and a fourth sub core forming the remaining half portion of the second closed loop.

In further embodiments, an insulator may be inserted between the first sub core and the second sub core and between the third sub core and the fourth sub core.

In still further embodiments, the apparatus may further include a phase adjuster provided at nodes between the RF power supply and the plurality of electromagnetic field applying units allows a phase of the RF signal to be locked in phase at each node In even further embodiments, the apparatus may further include shunt reactance elements coupled to nodes between the plurality of electromagnetic field applying units.

In yet further embodiments, an impedance of the shunt reactance element is adjusted to a half of a combined impedance of the secondary coil of the mutually-inductively coupled coils and the reactance element.

The reactance element may include a variable capacitor.

In other embodiments of the present invention, plasma generating apparatuses, includes: a process unit including a process chamber in which a substrate is disposed and providing a space in which a process is performed; a plasma generating unit generating plasma to provide the process unit with the plasma; and an exhausting unit exhausting gases and reaction byproducts in the process unit, wherein the plasma generating unit includes: an RF power supply supplying an RF signal; a plurality of electromagnetic field applying units inducing an electromagnetic field by receiving the RF signal; a plasma chamber providing a space in which the electromagnetic field applying unit is disposed and plasma is generated; and a reactance element coupled to a ground terminal of the electromagnetic field applying unit, wherein each of the electromagnetic field applying units includes a plurality of mutually-inductively coupled coils.

In some embodiments, the plurality of electromagnetic field applying units may be serially connected.

In other embodiments, coils included in each of the electromagnetic field applying units may have the same coil number of turns.

In still other embodiments, the plasma chamber may include a plurality of insulation loops disposed on the circumference thereof and the electromagnetic field applying unit may include: a first core made of a magnetic material and covering a first portion of the insulation loop; a second core made of a magnetic material and covering a second portion of the insulation loop; a primary coil wound around portions of the first and the second core; and a secondary coil wound around other portions of the first and the second core.

In even other embodiments, the first core may include: a first upper core covering an upper portion of a first part of the insulation loop; and a first lower core covering a lower portion of the first portion part of the insulation loop, and the second core may include: a second upper core covering an upper portion of a second part of the insulation loop; and a second lower core covering a lower portion of the second part of the insulation loop.

In yet other embodiments, an insulator may be inserted between the first upper core and the first lower core, and between the second upper core and the second lower core.

In further embodiments, the plasma generating unit may further include: phase adjusters provided at nodes between the RF power supply and the plurality of electromagnetic field applying units to allow a phase of the RF signal to be locked in phase at each node.

In still further embodiments, the plasma generating unit may further include shunt reactance elements coupled to nodes between the plurality of electromagnetic field applying units.

In even further embodiments, an impedance of the shunt reactance element may be adjusted to a half of a combined impedance of the secondary coil of the mutually-inductively coupled coils and the reactance element.

In yet further embodiments, the reactance element may include a variable capacitor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims.

If not defined otherwise, all of the terms used (including technical or scientific terms) are equivalent to the counterparts as understood generally by one in the skilled in the art. Usual terms as defined in the dictionary are to be interpreted correspondingly to the context of the related technology rather than ideally or excessively formally unless the present invention clearly defines the same.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. The word 'and/or' means that one or more or a combination of relevant constituent elements is possible.

Hereinafter, exemplary embodiments of the present invention will be described in detail with reference to the accompanying drawings.

Figure 1:
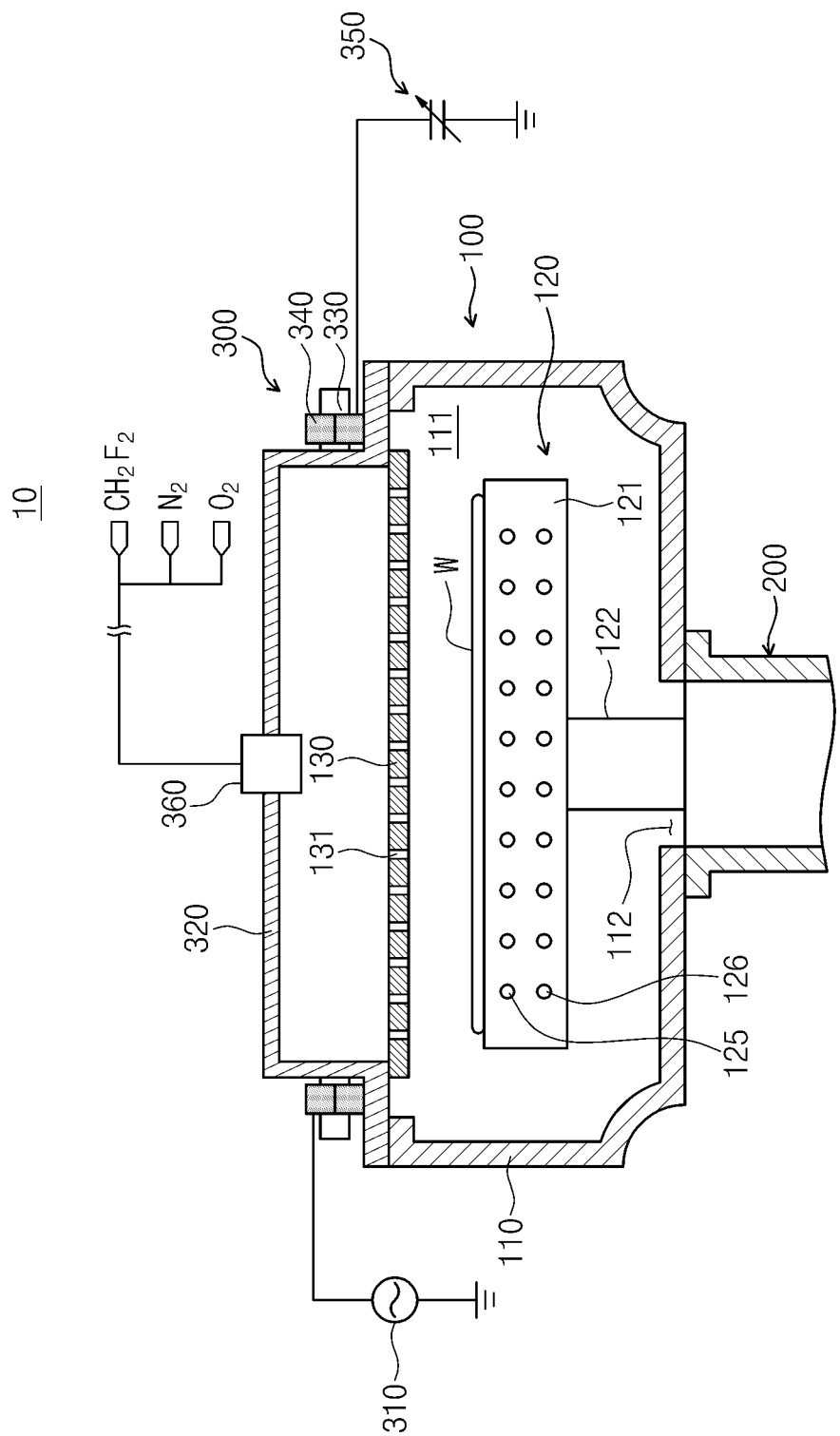
FIG. 1 is a schematic view illustrating an exemplary substrate treating apparatus according to an embodiment of the present invention.

FIG. 1 is a schematic view illustrating a substrate treating apparatus 10 according to an embodiment of the present invention.

Referring to FIG. 1, the substrate treating apparatus 10 may treat, e.g., etch or ash, a thin film on a substrate W using plasma. The thin film to be etched or ashed may be a nitride film. According to an embodiment, the nitride film may be a silicon nitride film.

The substrate treating apparatus 10 may include a process unit 100, an exhausting unit 200, and a plasma generating unit 300. The process unit 100 may provide a space, in which a substrate is placed and an etching or ashing process is performed. The exhausting unit 200 exhausts a process gas staying in the process unit 100 and a reaction byproduct generated from a substrate treating process to the outside, and maintains an internal pressure of the process unit 100 to a predetermined pressure. The plasma generating unit 300 may generate plasma from a process gas supplied from the outside and supply the plasma to the process unit 100.

The process unit 100 may include a process chamber 110, substrate supporting unit 120, and a baffle 130. A treating space 111 for performing a substrate treating process may be defined in the process chamber 110. An upper wall of the process chamber 110 is opened and an opening (not shown) may be formed in a sidewall thereof. The substrate may be transferred into the process chamber 110 through the opening. The opening may be opened/closed by an opening/closing member such as a door (not shown). An exhausting hole 112 may be formed in a bottom surface of the process chamber 110. The exhausting hole 112 is connected to the exhausting unit 200, and provides a passage through which gases and reaction byproducts staying in the process chamber 110 are exhausted to the outside.

The substrate supporting unit 120 may support the substrate W. The substrate supporting unit 120 may include a susceptor 121 and a supporting shaft 122. The susceptor 121 may be disposed in the treating space 111 and provided in a shape of circular disk. The susceptor 121 may be supported by the supporting shaft 122. The substrate W may be disposed on a top surface of the susceptor 122. An electrode (not shown) may be provided inside the susceptor 121. The electrode may be coupled to an external power supply and generate static electricity due to applied power. The generated static electricity may fix the substrate W to the susceptor 121. A heating member 125 may be provided in the susceptor 121. According to an example, the heating member 125 may be a heating coil. In addition, a cooling member 126 may be provided in the susceptor 121. The cooling member may be provided in a form of a cooling line through which a coolant flows. The heating member 125 may heat the substrate W to a preset temperature. The cooling member 126 may forcibly cool the substrate W. The substrate W which has been subjected to process treatment may be cooled down to a room temperature or a temperature suitable for a subsequent process.

A baffle 130 may be disposed over the susceptor 122. Holes 131 may be defined in the baffle 130. The holes 131 are provided as through-holes penetrating from a top surface to a bottom surface of the baffle 130, which are evenly distributed over the baffle 130.

Referring to FIG. 1 again, the plasma generating unit 300 may be disposed on the process chamber 110. The plasma generating unit 300 may generate plasma by discharging a source gas and provide the treating space 111 with the generated plasma. The plasma generating unit 300 may include an RF power supply 310, a plasma chamber 320, an insulation loop 330, and an electromagnetic field applying unit 340. Furthermore, the plasma generating unit 300 may further include a source gas supplier 360.

The plasma chamber 320 may be disposed on the process chamber 110 to be coupled to the process chamber 110. An upper end of the plasma chamber 320 may be coupled to the source gas supplier 360. The source gas may be supplied into a discharging space in the plasma chamber 320. The source gas may include difluoromethane ($CH_2F_2$), nitrogen ($N_2$), and oxygen ($O_2$). Alternatively, the source gas may further include different kinds of gases such as tetrafluoromethane ($CF_4$).

The electromagnetic field applying unit 340 may be installed on a sidewall of the plasma chamber 320 through the insulation loop 330. The RF power supply 310 may provide the electromagnetic field applying unit 340 with a high-frequency current. The high-frequency current forms an inductive electromagnetic field in the discharging space in which the source gas receives energy required for ionization from the inductive electromagnetic field to be converted into a plasma state. A reactance element such as a capacitor 350 may be coupled to a ground terminal of the electromagnetic field applying unit 340. Alternatively, according to another embodiment, the electromagnetic field applying unit may be directly grounded without a capacitor connected thereto.

A structure of the plasma generating unit 300 is not limited to above-mentioned examples and various structures for generating plasma from a source gas may be used.

Figure 2:
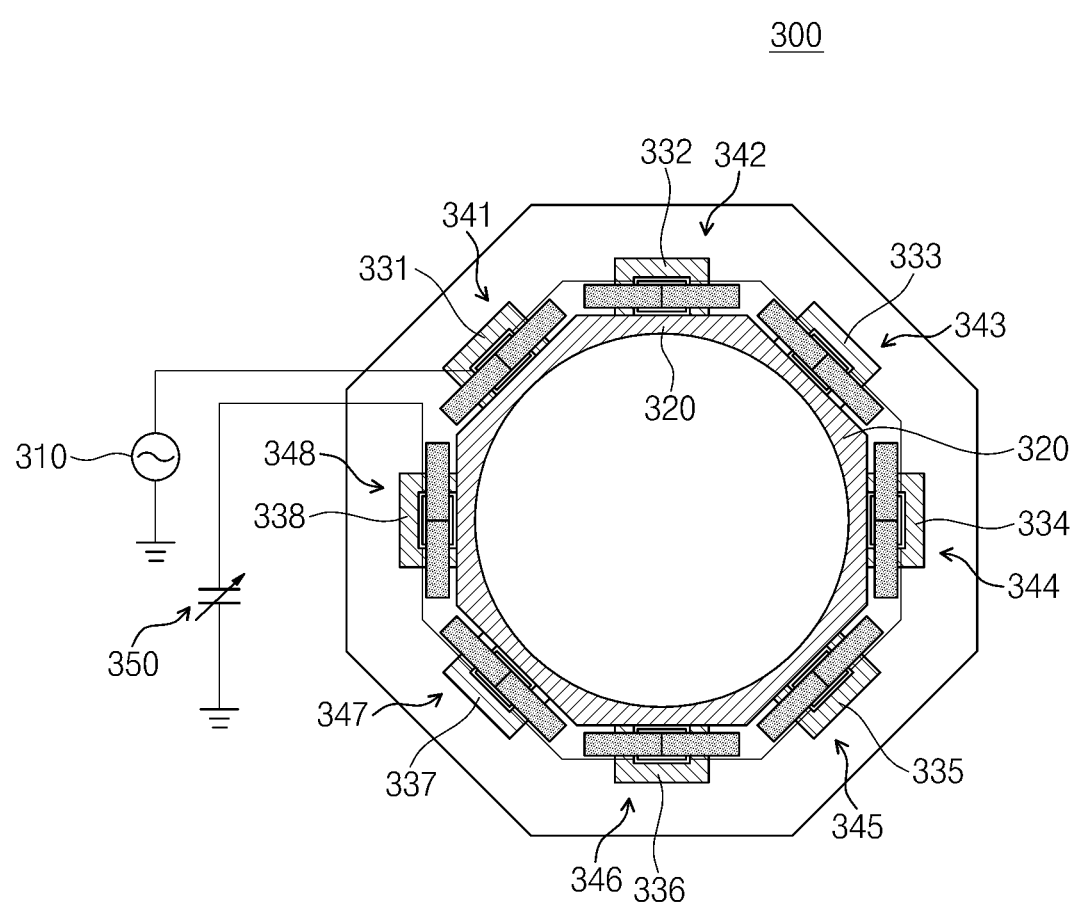
FIG. 2 is an exemplary plane view of a plasma generating unit according to an embodiment of the present invention.

FIG. 2 is an exemplary plane view of the plasma generating unit 300 according to an embodiment of the present invention.

As illustrated in FIG. 2, the plasma generating unit 300 may include an RF power supply 310, a plasma chamber 320, a plurality of electromagnetic field applying units 341 to 348, and a reactance element 350.

The RF power supply 310 may provide an RF signal. The electromagnetic field applying units 341 to 348 may induce an electromagnetic field by receiving the RF signal. The plasma chamber 320 may provide a space where the electromagnetic field applying units 341 to 348 are placed and plasma is generated. The reactance element 350 may be coupled to the ground terminal of the electromagnetic field applying unit 348.

According to an embodiment, the RF power supply 310 may generate and output an RF signal to the electromagnetic field applying units 341 to 348. The RF power supply 310 may deliver high-frequency power to the plasma chamber 320 through the RF signal. According to an embodiment of the present invention, the RF power supply 310 may generate and output the RF signal in a sine waveform, but the RF signal is not limited thereto. Thus, the RF signal may have various types of waveforms such as a square wave, a chopping wave, a saw-toothed wave, and a pulse wave.

The plasma chamber 320 may provide a space where a source gas is injected and the injected gas is converted into a plasma state. According to an embodiment, the plasma chamber 320 may provide a space in which the gas injected into the chamber is excited into a plasma state by using the high-frequency power delivered through the RF signal.

According to an embodiment, the plasma chamber 320 may have an outer wall with a polygonal cross section. For instance, as illustrated in FIG. 2, the plasma chamber 320 may have the outer wall with an octagonal cross section, but a shape of the cross section is not limited thereto.

According to an embodiment of the present invention, the cross-section shape of the outer wall of the plasma chamber 320 may depend on number of the electromagnetic field applying units arranged on the chamber. For instance, as illustrated in FIG. 2, when the plasma chamber 320 has the outer wall with the octagonal cross section, the electromagnetic field applying units may be disposed on a sidewall corresponding to each side of the octagon.

Accordingly, when the outer wall of the plasma chamber 320 has the polygonal cross section, the number of sides of the polygon may be equal to the number of the electromagnetic field applying units. In addition, as illustrated in FIG. 2, an inner wall of the plasma chamber 320 may have a circular-shaped cross section, but the cross section shape of the inner wall is not limited thereto.

The electromagnetic field applying units 341 to 348 are disposed on the plasma chamber 320 and may induce an electromagnetic field in the chamber by receiving the RF signal from the RF power supply 310.

According to an embodiment, the electromagnetic field applying units 341 to 348 may be disposed on the chamber through the insulation loop formed on a circumference of the plasma chamber 320.

For instance, as illustrated in FIG. 2, a plurality of insulation loops 331 to 338 may be disposed on a circumference of the plasma chamber 320. The insulation loops 331 to 338 are made of an insulator, e.g. quartz or ceramic, but are not limited thereto.

The plurality of insulation loops 331 to 338 may be disposed along the circumference of the plasma chamber 320. For instance, as illustrated in FIG. 2, the plurality of insulation loops 331 to 338 may be installed on the outer wall of the plasma chamber 320 at predetermined intervals. The plasma generating unit 300 illustrated in FIG. 2 includes eight insulation loops 331 to 338, but the number of the insulation loops may be changed according to an embodiment.

The insulation loops 331 to 338 may form a closed loop in company with the outer wall of the plasma chamber 320. For instance, as illustrated in FIG. 2, the insulation loops 331 to 338 may be formed in a shape of '⊂' or 'U' and form a closed loop when installed on the outer wall of the plasma chamber 320.

The electromagnetic field applying units 341 to 348 may be installed on the insulation loops 331 to 338.

Figure 3:
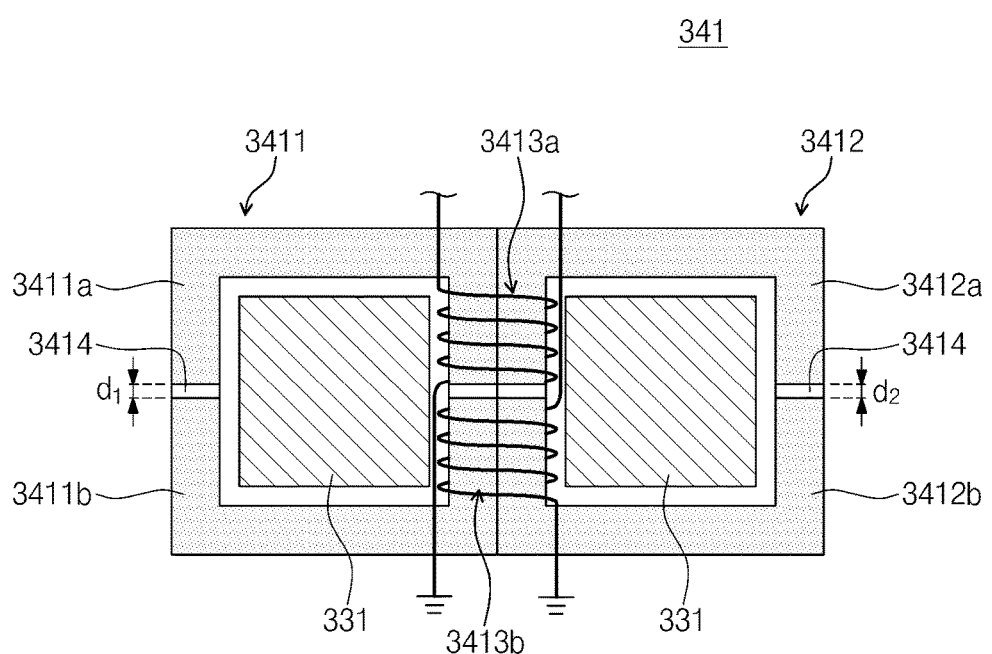
FIG. 3 is an exemplary front view of an electromagnetic field applying unit according to an embodiment of the present invention.

FIG. 3 is an exemplary front view of the electromagnetic field applying unit 341 according to an embodiment of the present invention.

The electromagnetic field applying unit 341 may include a first core 3411, a second core 3412, a primary coil 3413a, and a secondary coil 3413b. The first core 3411 is made of a magnetic material and may cover a first part of the insulation loop 331. The second core 3412 is also made of a magnetic material and may cover a second part of the insulation loop 331. The primary coil 3413a may be wound around portions of the first core 3411 and the second core 3412. The secondary coil 3413b may be wound around other portions of the first core 3411 and the second core 3412.

As illustrated in FIG. 3, according to an embodiment, the first core 3411 may include a first upper core 3411a covering an upper portion of the first part of the insulation loop 331 and a first lower core 3411b covering a lower portion of the first part of the insulation loop 331.

Likewise, the second core 3412 may include a second upper core 3412a covering an upper portion of the second part of the insulation loop 331 and a second lower core 3412b covering a lower portion of the second part of the insulation loop 331.

As illustrated in FIG. 3, the first core 3411 and the second core 3412 may be in contact with each other and the primary coil 3413a and the secondary coil 3413b may be wound around portions of the first and second cores 3411 and 3412 which are in contact with each other.

Accordingly, the primary coil 3413a and the secondary coil 3413b share the cores and are wound around the cores while being separated from each other, so that the primary coil 3413a and the secondary coil 3413b may be mutually-inductively coupled.

According to an embodiment, coils included in each of the electromagnetic field applying units, e.g., the primary coil 3413a and the secondary coil 3413b, may have the same number of turns. In other words, a turn ratio of two mutually-inductively coupled coils may be 1:1.

According to an embodiment, as illustrated in FIG. 3, an insulator 3414 may be inserted between the first upper core 3411a and the first lower core 3411b. Likewise, an insulator 3414 may be inserted between the second upper core 3412a and the second lower core 3412b.

The insulator may be a tape made of an insulating material, and in this case, one or more insulating tapes may be attached between the upper core and the lower core to adjust gaps d1 and d2 between the upper core and the lower core.

As the gaps d1 and d2 between the upper core and the lower core become larger, a coupling coefficient between the core and the coil becomes lower and thus an inductance may become smaller. As the inductance becomes smaller, an impedance of the electromagnetic field applying unit becomes smaller. Therefore, the gaps may be determined according to the density of plasma to be generated using the plasma generating unit 300.

An embodiment illustrated in FIG. 3 is configured by equally dividing each core 3411 and 3412 into two sub-cores 3411a and 3411b, 3412a and 3412b. However, according to embodiments, each core may be integrally formed, and furthermore both the first and the second core 3411 and 3412 may be integrally formed.

In an embodiment illustrated in FIG. 3, description was made on only one of the plurality of electromagnetic field applying units 341 to 348, but the other electromagnetic field applying units may also be configured in the same way.

Figure 4:
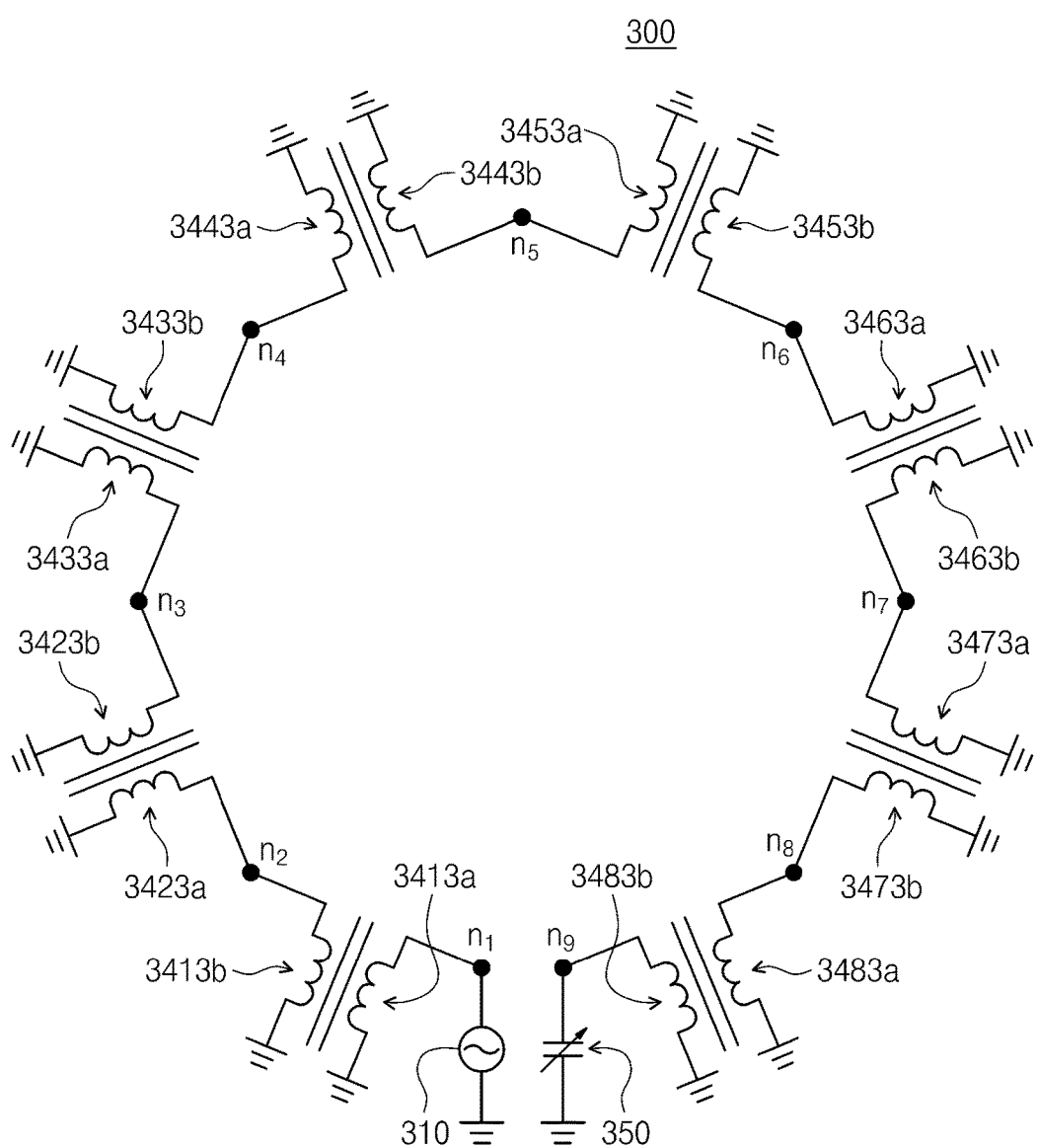
FIG. 4 is an equivalent circuit diagram illustrating a plasma generating unit according to an embodiment of the present invention.

FIG. 4 is an equivalent circuit diagram illustrating a plasma generating unit 300 according to an embodiment of the present invention.

As illustrated in FIG. 4, since the primary coil and the secondary coil included in each of the electromagnetic field applying units are mutually-inductively coupled and a turn ratio of both the coils is 1:1, the electromagnetic field applying unit may correspond to a 1:1 voltage transformer.

According to an embodiment, the plurality of electromagnetic field applying units 341 to 348 may be serially connected to each other.

Even though the plurality of electromagnetic field applying units 341 to 348 are serially connected to each other, the coils included in each of the electromagnetic field applying units are mutually-inductively coupled to realize the 1:1 voltage transformer, and thus all voltages applied to respective nodes $n_1$ to $n_9$ of the plasma generating units 300 may have the same level.

As a result, all intensities of electromagnetic fields inducted by each of the electromagnetic field applying units become same and the density of plasma generated in the chamber may be uniform over the circumference of the chamber.

Figure 5:
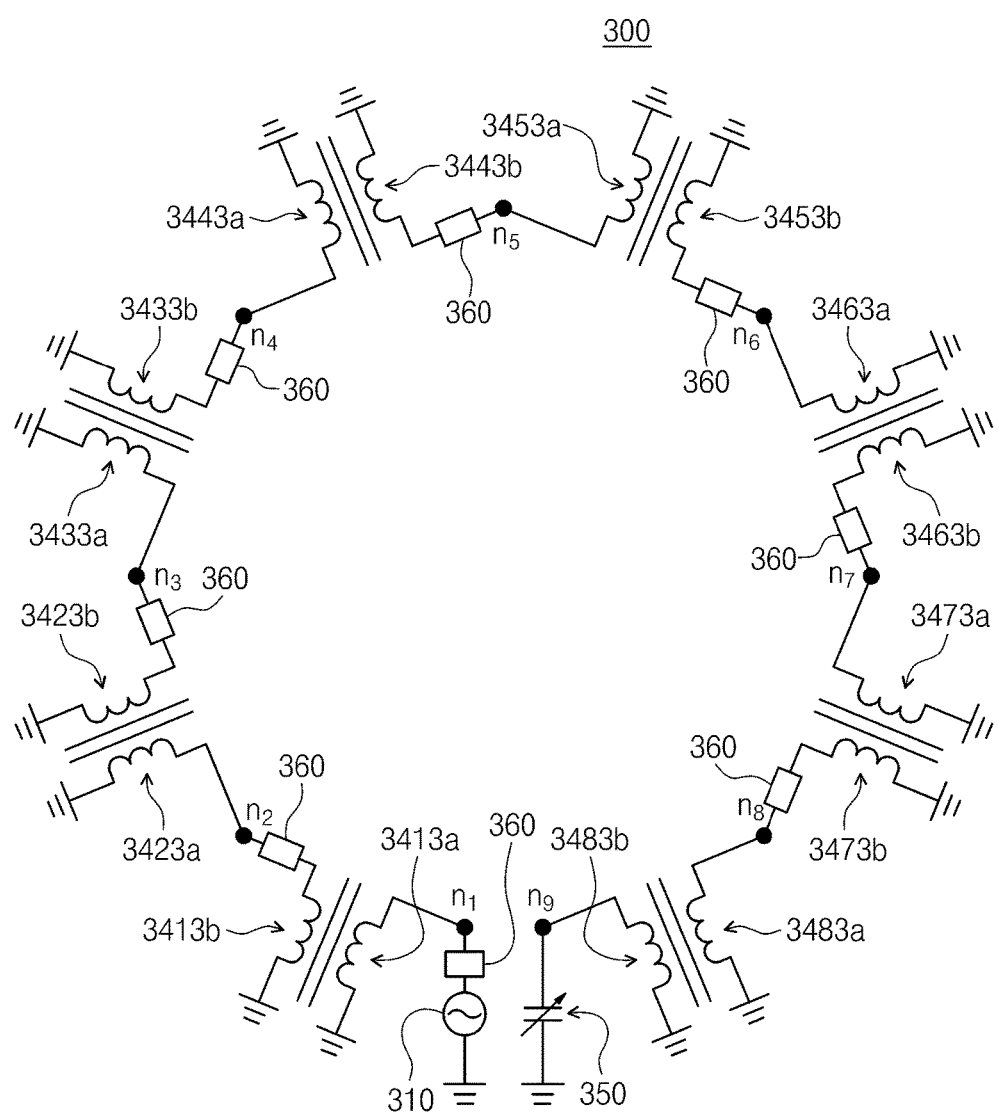
FIG. 5 is an equivalent circuit diagram illustrating a plasma generating unit according to another embodiment of the present invention.

FIG. 5 is an equivalent circuit diagram illustrating a plasma generating unit 300 according to another embodiment of the present invention.

As illustrated in FIG. 5, the plasma generating unit 300 may further include phase adjusters 360. The phase adjusters 360 are provided at nodes $n_1$ to $n_8$ between an RF power supply and a plurality of electromagnetic field applying units 341 to 348 to allow a phase of an RF signal to be locked in phase.

According to the embodiment, the phase as well as amplitude of the voltage applied to each node of the plasma generating unit 300 may be equally adjusted.

Figure 6:
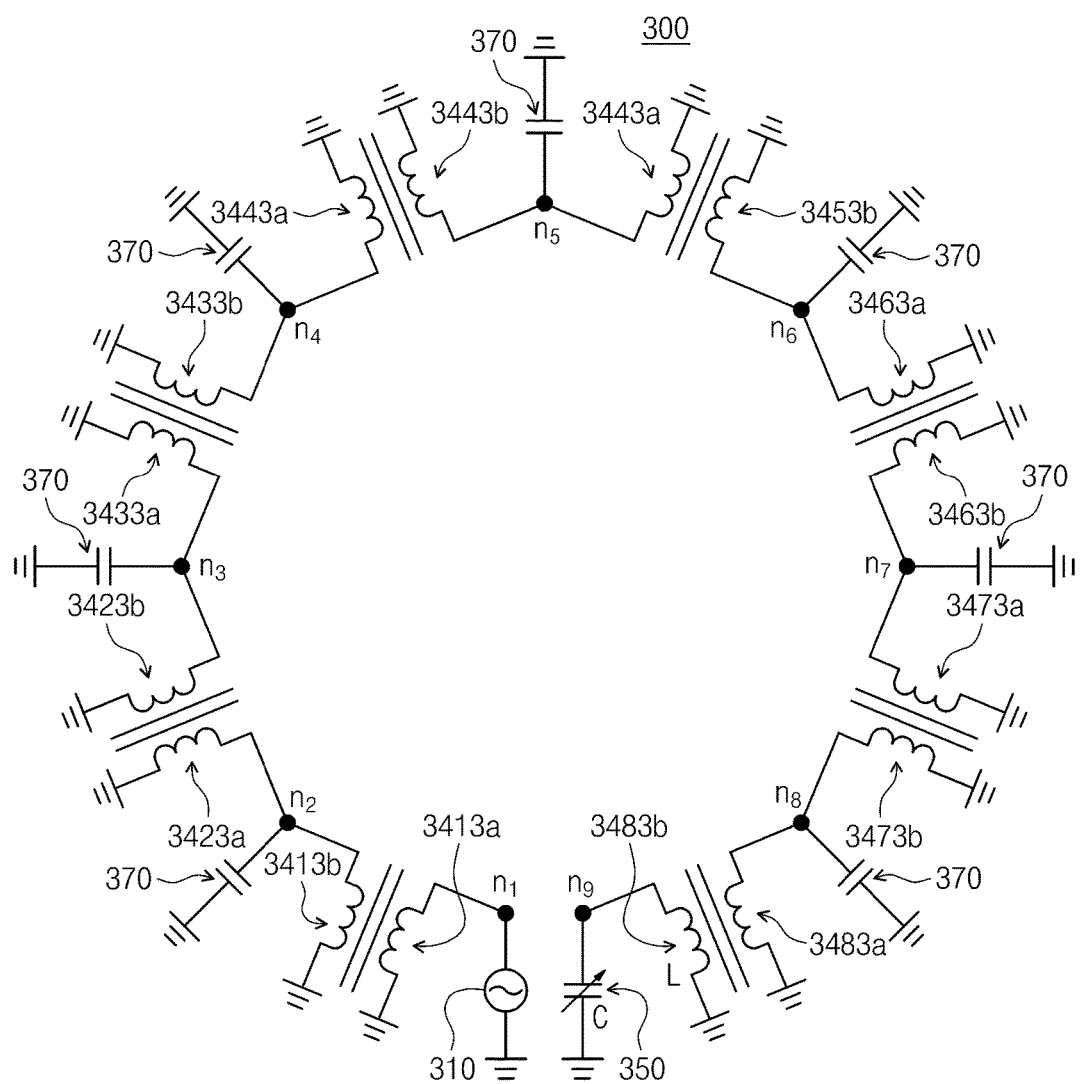
FIG. 6 is an equivalent circuit diagram illustrating a plasma generating unit according to another embodiment of the present invention.

FIG. 6 is an equivalent circuit diagram illustrating a plasma generating unit 300 according to another embodiment of the present invention.

As illustrated in FIG. 6, the plasma generating unit 300 may further include shunt reactance elements 370. The shunt reactance elements 370 may be coupled to nodes $n_2$ to $n_8$ between the plurality of electromagnetic field applying units 341 to 348. In other words, one ends of the shunt reactance elements 370 may be coupled to nodes $n_2$ to $n_8$ between the plurality of electromagnetic field applying units 341 to 348 and the other ends thereof may be grounded.

According to an embodiment, the shunt reactance element 370 may be a capacitor which is a capacitive element, and the impedance thereof may be a half of a combined impedance of the secondary coil L of the mutually-inductively coupled coils and the reactance element C coupled to a ground terminal.

According to this embodiment, the shunt reactance element 370 may allow voltages of both an input terminal at a power supply side and an output terminal at a ground terminal side in the plasma generating unit 300 to have the same level.

According to an embodiment of the present invention, the reactance element 350 may include a variable capacitor. According to the embodiment, the plasma generating unit 300 may adjust a capacitance of the variable capacitor to control a voltage drop of each of the electromagnetic field applying units.

For instance, when an impedance is increased by decreasing the capacitance of the variable capacitor, a voltage drop of each of the electromagnetic field applying units is relatively decreased as a result of the increased voltage drop of the variable capacitor.

For another instance, when an impedance is decreased by increasing the capacitance of the variable capacitor, a voltage drop of each of the electromagnetic field applying units is relatively increased as a result of the decreased voltage drop of the variable capacitor.

Therefore, the plasma generating unit 300 may adjust a voltage drop of the electromagnetic field applying unit by adjusting the capacitance of the variable capacitor, so as to gain desired plasma density according to a substrate treating process, conditions in the chamber, or the like.

Figure 7:
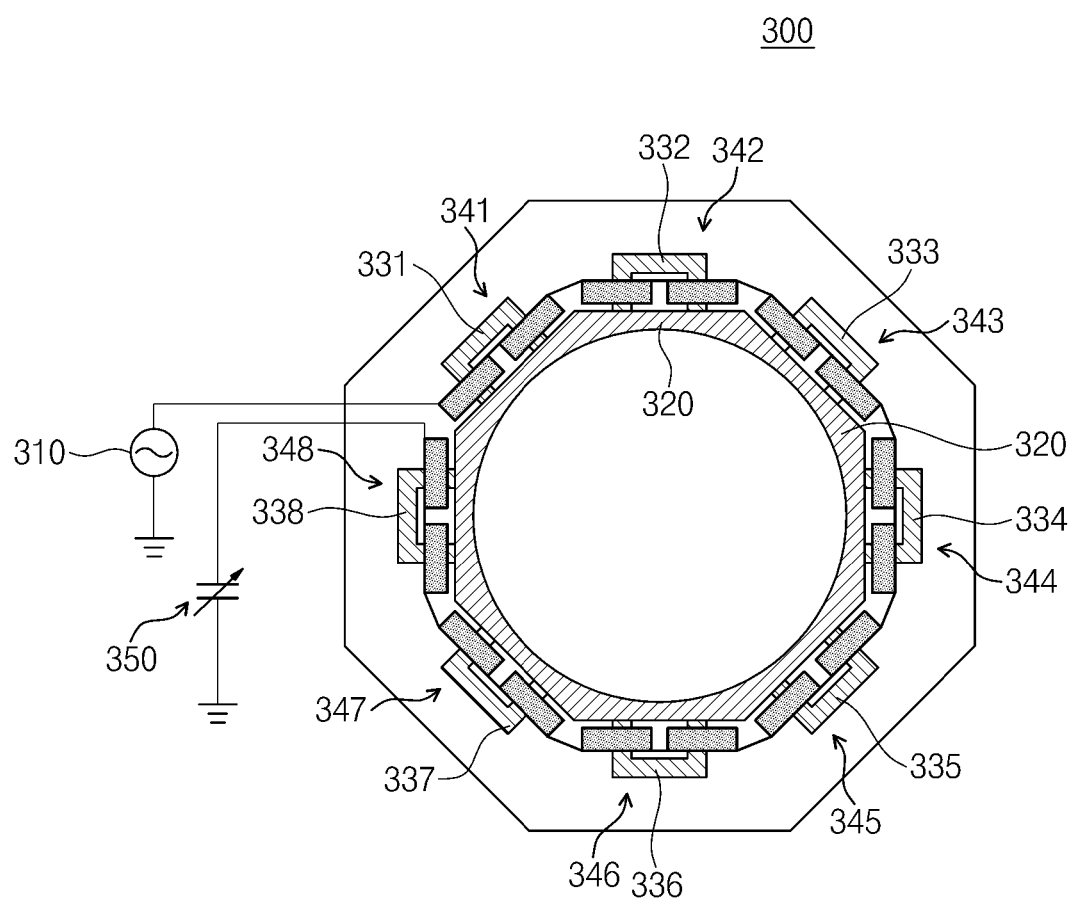
FIG. 7 is an exemplary plane view of a plasma generating unit according to another embodiment of the present invention.

FIG. 7 is an exemplary plane view of a plasma generating unit 300 according to another embodiment of the present invention.

An embodiment illustrated in FIG. 7 is different from the embodiment illustrated in FIG. 2 in that the embodiment of FIG. 7 has a configuration in which first and second cores are spaced apart from each other, a primary coil is wound around a portion of each core, and a secondary coil is wound around another portion of each core, whereas the embodiment of FIG. 2 has the configuration in which the first and the second core 3411 and 3412 included in each of the electromagnetic field applying units are in contact with each other and the primary and secondary coils 3413a and 3413b are wound around portions of the cores which are in contact with each other.

Figure 8:
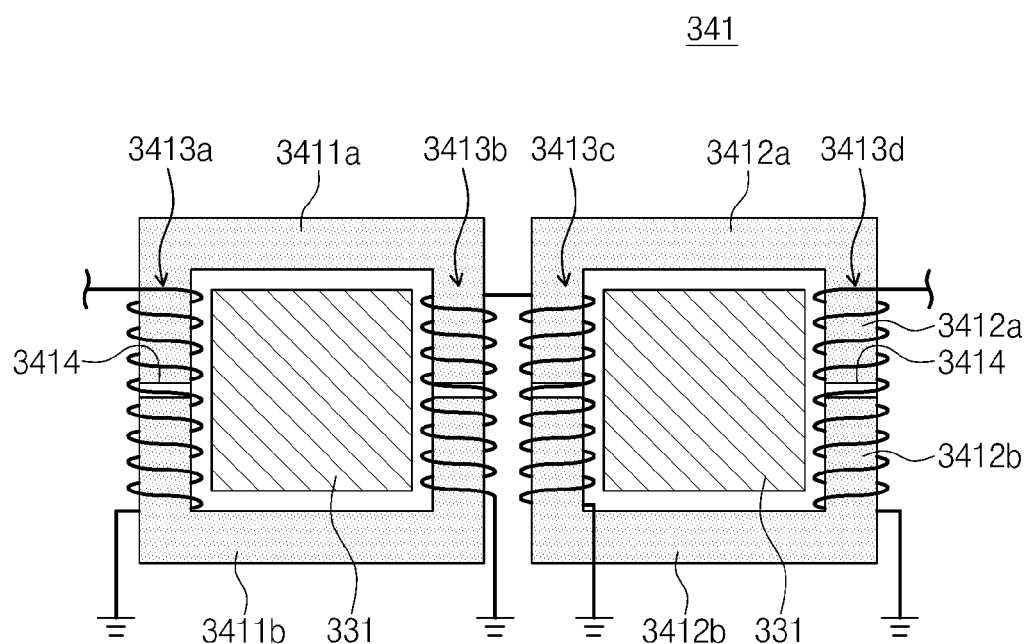
FIG. 8 is an exemplary front view of an electromagnetic field applying unit according to another embodiment of the present invention.

FIG. 8 is an exemplary front view of the electromagnetic field applying unit 341 according to another embodiment of the present invention.

As illustrated in FIG. 8, in the electromagnetic field applying unit 341 according to another embodiment of the present invention, a first core 3411 and a second core 3412 are spaced apart from each other, primary coil 3413a and 3413c may be wound around a portion of each core, and secondary coil 3413b and 3413d may be wound around another portion of the core.

Each of the first and the second core 3411 and 3412 separately form a closed loop and the primary coil 3413a and 3413c and the secondary coil 3413b and 3413d share one core to be mutually inductively coupled.

All the coils may have the same number of turns, and, in this case, the turn ratio of the primary coil 3413a and 3413c to the secondary coil 3413b and 3413d becomes 1:1 to thereby realize a 1:1 voltage transformer through each core and coils wound therearound.

Figure 9:
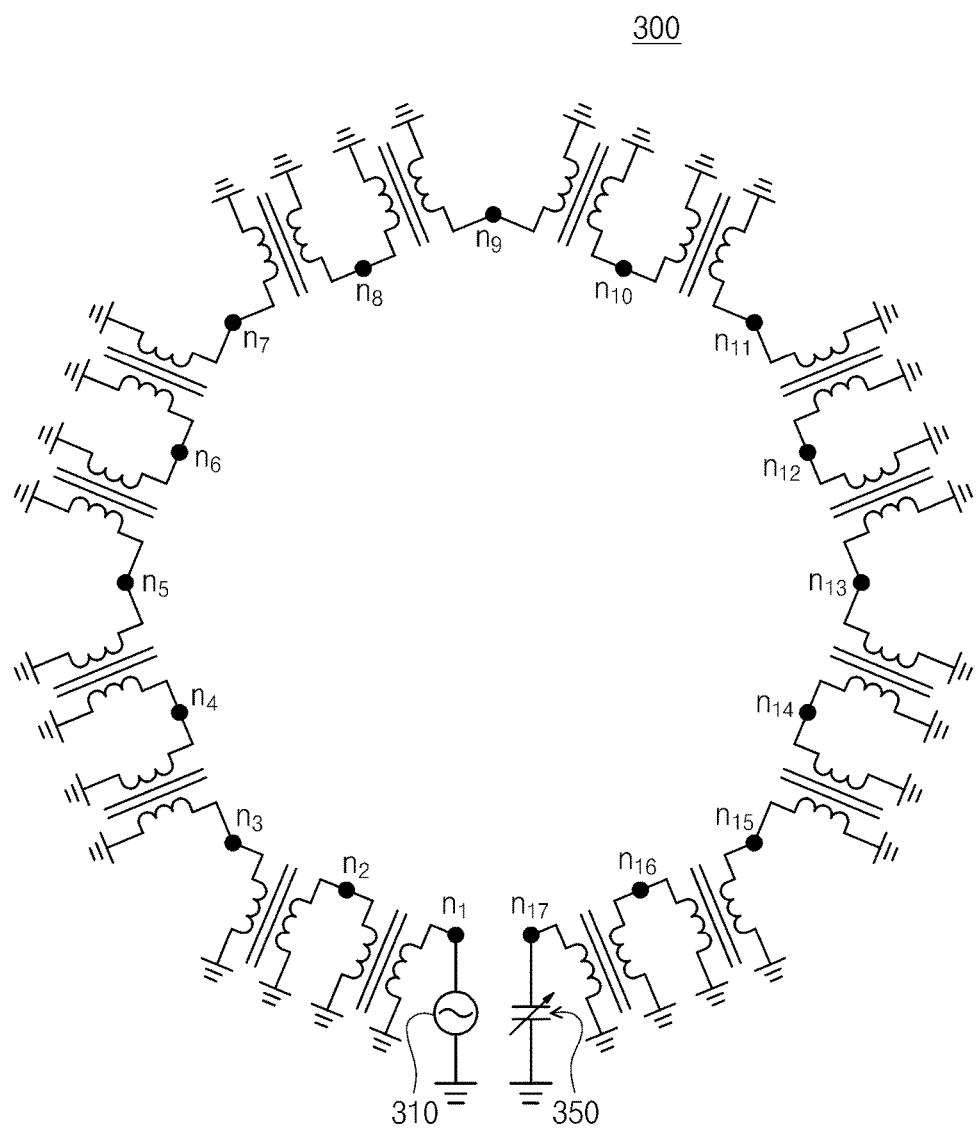
FIG. 9 is an equivalent circuit diagram illustrating a plasma generating unit according to another embodiment of the present invention.

FIG. 9 is an equivalent circuit diagram illustrating a plasma generating unit 300 according to another embodiment of the present invention.

As illustrated in FIG. 9, each core and the coils wound therearound in the electromagnetic field applying units 341 to 348 may form a mutual inductive coupled circuit to correspond to the 1:1 voltage transformer.

As a result, a voltage applied to each node $n_1$ to $n_{17}$ of the plasma generating unit 300 may be adjusted to have the same level.

According to an embodiment, the phase adjuster 360 is further provided on the nodes $n_1$ to $n_{16}$ to allow a phase of an RF signal to be locked in phase at each node.

According to an embodiment, one end of a shunt reactance element 370 may be coupled to nodes $n_2$ to $n_{16}$ and the other end thereof may be grounded. The shunt reactance element 370 may be a capacitor and an impedance thereof may be adjusted to a half of a combined impedance of the secondary coil L of the mutually-inductively coupled coils and the reactance element C.

Referring to FIG. 8 again, as same as the above mentioned embodiment illustrated in FIG. 3, the first core 3411 may include a first sub core forming a half portion of a closed loop, e.g., the first upper core 3411a, and a second sub core forming the remaining half portion of the closed loop, e.g., the first lower core 3411b. Likewise, the second core 3412 may include a third sub core forming a half portion of a closed loop, e.g., the second upper core 3412a, and a fourth sub core forming the remaining half portion of the closed loop, e.g., the second lower core 3412b.

According to an embodiment, an insulator 3414 may be inserted between the first sub core and the second sub core, and as the insulator 3414 may also be inserted between the third sub core and the fourth sub core.

According to embodiments of the present invention, plasma may be uniformly generated in a chamber. Especially, plasma may be uniformly generated even in a large-sized chamber for treating a large-area substrate.

According to embodiments of the present invention, a yield of a large-area substrate treating process may be increased.

The above embodiments of the present invention has been described above should not be construed as being limited to the embodiments set forth herein.

Those of ordinary skilled in the art understand that various changes in forms and details may be made therein. The scope of the present invention is defined by the appended claims and the exemplary embodiments described therein.

What is claimed is:

1. A plasma generating apparatus, comprising:
an RF power supply configured to provide an RF signal;
a plurality of electromagnetic field applying units configured to induce an electromagnetic field by receiving the RF signal; and
a reactance element coupled to a ground terminal,
wherein each of the plurality of electromagnetic field applying units comprises a core structure made of a magnetic material and a plurality of coils, and the plurality of coils are inductively coupled with and physically separated from each other,
the plurality of electromagnetic field applying units are arranged in series between the RF power supply and the reactance element, and
the core structure comprises a first core and a second core, the first core having a first loop shape, the first loop shape having a first opening that extends through the first core at a circumference thereof, the second core having a second loop shape, the second loop shape having a second opening that extends through the second core at a circumference thereof, an unopened portion of the second core being in contact with an unopened portion of the first core,
wherein the first core comprises,
a first sub core forming a half portion of the first loop shape, and
a second sub core forming the remaining half portion of the first loop shape,
wherein the second core comprises,
a third sub core forming a half portion of the second loop shape, and
a fourth sub core forming the remaining half portion of the second loop shape, and
wherein a first insulator is provided between the first sub core and the second sub core, and
a second insulator is provided between the third sub core and the fourth sub core.

2. The plasma generating apparatus of claim 1, wherein the plurality of coils included in each of the plurality of electromagnetic field applying units each have a same number of turns.

3. The plasma generating apparatus of claim 1,
wherein the plurality of coils in the at least one of the plurality of electromagnetic field applying units comprises:
a primary coil wound around a portion of the core structure; and
a secondary coil wound around another portion of the core structure, the secondary coil inductively coupled to and physically-separated from the primary coil.

4. The plasma generating apparatus of claim 3,
wherein the primary coil and the secondary coil wound around the first and second cores at a location where the first and second cores are in contact with each other.

5. The plasma generating apparatus of claim 1, further comprising:
phase adjusters at nodes between the RF power supply and the plurality of electromagnetic field applying units, respectively, the phase adjusters configured to allow a phase of the RF signal to be locked in phase at each node.

6. The plasma generating apparatus of claim 1, further comprising:
shunt reactance elements coupled to nodes between the plurality of electromagnetic field applying units, respectively.

7. The plasma generating apparatus of claim 6, wherein when the plurality of coils comprises a primary coil and a secondary coil inductively coupled to and physically separated from the primary coil, the shunt reactance element is configured to adjust an impedance thereof to a half of a combined impedance of the secondary coil and the reactance element.

8. The plasma generating apparatus of claim 1, wherein the reactance element comprises a variable capacitor.

9. A substrate treating apparatus, comprising:
a process chamber including a first space for accommodating a substrate to be processed therein;
a plasma generator configured to generate and provide plasma to provide the process chamber; and
an exhaust configured to exhaust gases and reaction byproducts in the process chamber,
wherein the plasma generator comprises,
an RF power supply configured to supply an RF signal;
a plurality of electromagnetic field applying units configured to induce an electromagnetic field by receiving the RF signal;
a plasma chamber on the process chamber, the plasma chamber including a second space for accommodating the plurality of electromagnetic field applying units, the plasma chamber configured to generate plasma; and
a reactance element coupled to a ground terminal,
wherein each of the plurality of electromagnetic field applying units comprises a core structure made of a magnetic material and a plurality of coils, and the plurality of coils are inductively coupled with and physically separated from each other,
the plurality of electromagnetic field applying units are arranged in series between the RF power supply and the reactance element,
the core structure comprises a first core and a second core, the first core having a first loop shape, the first loop shape having a first opening that extends through the first core at a circumference thereof, the second core having a second loop shape, the second loop shape having a second opening that extends through the second core at a circumference thereof, an unopened portion of the second core being in contact with an unopened portion of the first core,
wherein the first core comprises,
a first sub core forming a half portion of the first loop shape, and
a second sub core forming the remaining half portion of the first loop shape,
wherein the second core comprises,
a third sub core forming a half portion of the second loop shape, and
a fourth sub core forming the remaining half portion of the second loop shape, and
wherein a first insulator is provided between the first sub core and the second sub core, and
a second insulator is provided between the third sub core and the fourth sub core.

10. The substrate treating apparatus of claim 9, wherein the plurality of coils included in each of the plurality of electromagnetic field applying units each have a same number of turns.

11. The substrate treating apparatus of claim 9, wherein the plasma generator further comprises:
phase adjusters at nodes between the RF power supply and the plurality of electromagnetic field applying units, respectively, the phase adjusters configured to allow a phase of the RF signal to be locked in phase at each node.

12. The substrate treating apparatus of claim 9, wherein the plasma generator comprises:
shunt reactance elements coupled to nodes between the plurality of electromagnetic field applying units, respectively.

13. The substrate treating apparatus of claim 12, wherein when the plurality of coils comprises a primary coil and a secondary coil inductively coupled to and physically separated from the primary coil, the shunt reactance element is configured to adjust an impedance thereof to a half of a combined impedance of the secondary coil and the reactance element.

14. The substrate treating apparatus of claim 9, wherein the reactance element comprises a variable capacitor.

* * * * *